United States Patent [19]

Kinoshita

[11] Patent Number: 4,709,160

[45] Date of Patent: Nov. 24, 1987

[54] SOLID STATE DC POWER SWITCH

[75] Inventor: Roy Y. Kinoshita, Anaheim, Calif.

[73] Assignee: Rockwell International Corporation, El Segundo, Calif.

[21] Appl. No.: 900,213

[22] Filed: Aug. 25, 1986

[51] Int. Cl.[4] .................... H03K 17/08; H03K 17/56; H03K 17/60; H03K 17/687

[52] U.S. Cl. .................................. 307/253; 307/571; 323/285; 361/93; 361/100

[58] Field of Search .................... 307/252 J, 253, 571; 323/285; 361/91, 93, 100, 101

[56] References Cited

U.S. PATENT DOCUMENTS 3,218,542 11/1965 Taylor .............................. 307/252 J
3,821,565 6/1974 Horinaga .......................... 307/252 J
4,575,673 3/1986 Tedeschi et al. .................... 328/285

OTHER PUBLICATIONS

G. A. Ruddy, "Constant-Voltage Switching Regulator" IBM Technical Disclosure Bulletin vol. 14, No. 9, Feb. 1972, pp. 2784-2785.

Primary Examiner—John Zazworsky
Attorney, Agent, or Firm—H. Fredrick Hamann; George A. Montanye; James F. Kirk

[57] ABSTRACT

A dc power switch responsive to an input signal referenced to a signal reference terminal and having a power input terminal connected to a dc voltage source and a power output terminal connected to a load. The dc switch has an isolated voltage source referenced to the signal reference terminal; a current limiting resistor; and a two-pole switching circuit for coupling the isolated voltage source to the current limiting resistor. An output switching circuit couples current from the voltage source via the conduction channel to the signal reference terminal. A sense resistor has a first terminal coupled to the signal reference terminal and a second terminal coupled to the power output terminal. A SCR switching circuit latches into a conducting state in response to the firing signal and shunting current from the isolated source via the current limiting resistor second terminal to the power output terminal thereby shunting the control signal high state to a control signal low state in response to the firing.

12 Claims, 5 Drawing Figures

SOLID STATE DC POWER SWITCH

This invention was made with Government support under Contract No. N62269-85-C-0224 awarded by the Navy. The Government has certain rights in this invention.

BACKGROUND OF THE INVENTION

1. Field of the Invention

This invention relates to the field of electrical switches and particularly to the field of remotely controlled electrical switches capable of interrupting the application of a source voltage to a load in response to an overload condition.

This invention relates more particularly to the field of solid state power controllers for dc (direct current) service or solid state electrical switches such as solid state relays for use in aircraft applications capable of detecting overload conditions, such as those caused by battle damage, and is able to instantly interrupt electrical service to the load automatically thereby preventing or limiting further damage to the service or load or lead wire. This invention circuit has the additional capability of being remotely resettable after clearing the damage or overload condition. Applications for the invention solid state dc switch include marine as well as aircraft and industrial applications that require noise free closure and interruption of dc source power, compact size, extended switch life, low power dissipation, immunity to high vibration, mechanical shock and high reliability.

2. Description of the Prior Art

Electromechanical switching devices using solenoid driven means to transfer eletromechanical contacts to apply a source voltage to a load, such as relays are well known. When coupled with an electromechanical circuit breaker, a relay provides a remotely controllable power control function capable of supplying ac or dc service to load via its closed contacts in series with an electromechanical circuit breaker. Electromechanical switching devices, such as relays, provide a very low voltage drop at the switch closure thereby affording low power dissipation.

As used in dc power control applications, mechanical contacts cannot apply or remove power to a load free of bounce and arcing. Mechanical wear, electrical arcing and slow response also limit the application of electromechanical devices to applications requiring low closing cycle rates.

The solid state dc SWITCH is known to overcome the problem of contact bounce in applying a source voltage to a load. Solid state dc switches are also able to interrupt load current. However, solid state dc switches introduce a substantial voltage drop at the point of circuit closure, thereby providing relatively high power dissipation in comparison to eletromechanical switching devices. Solid state dc switches find their greatest application in controlling electrical service to loads requiring relatively low load currents.

Circuit breakers used to protect the electrical service for a load are typically complex mechanical devices that rely on magnetic circuits or thermally actuated means to detect an overload condition. Environmental effects such as vibration, moisture, temperature and age along with operational effects such as thermal and mechanical fatigue from past overload cycle experiences contribute to the degradation of these assemblies. Contact arcing that is sustained by a high voltage source as the contacts part to protect a circuit experiencing overload conditions, contribute to circuit breaker contact degradation, and produce transient noise disturbances that can contribute to error logic signal generation. In addition, mechanical switches provide no means for controlling the rate of rise of voltage on the load as the switch is closed.

SUMMARY OF THE INVENTION

It is an objective of this invention to provide a solid state switch that functions to switch dc power to a load in response to an input control signal assuming a first state and to interrupt power to the load in response to the input control signal assuming a second state.

It is another objective of this invention to implement a solid state dc switch circuit having the ability to independently detect over current conditions and to respond by interrupting the circuit so as to protect the electrical service to the load. After tripping, in response to an overload condition, the invention circuit remains "tripped" until the input control signal is removed.

The invention solid state dc power switch provides the function of a remotely resettable solid state circuit breaker by detecting and independently interrupting electrical service to a load due to an overload condition.

Another objective of this invention is to limit contact arcing and contact bounce as the invention solid state dc switch applies or interrupts electrical service to a load in response to an input control signal or as the switch independently interrupts the service in response to an overload condition.

BRIEF DESCRIPTION OF THE DRAWINGS

The invention will be further described as to an illustrative embodiment in conjunction with the accompanying drawings in which.

DESCRIPTION OF THE PREFERRED EMBODIMENT

Figure 1:
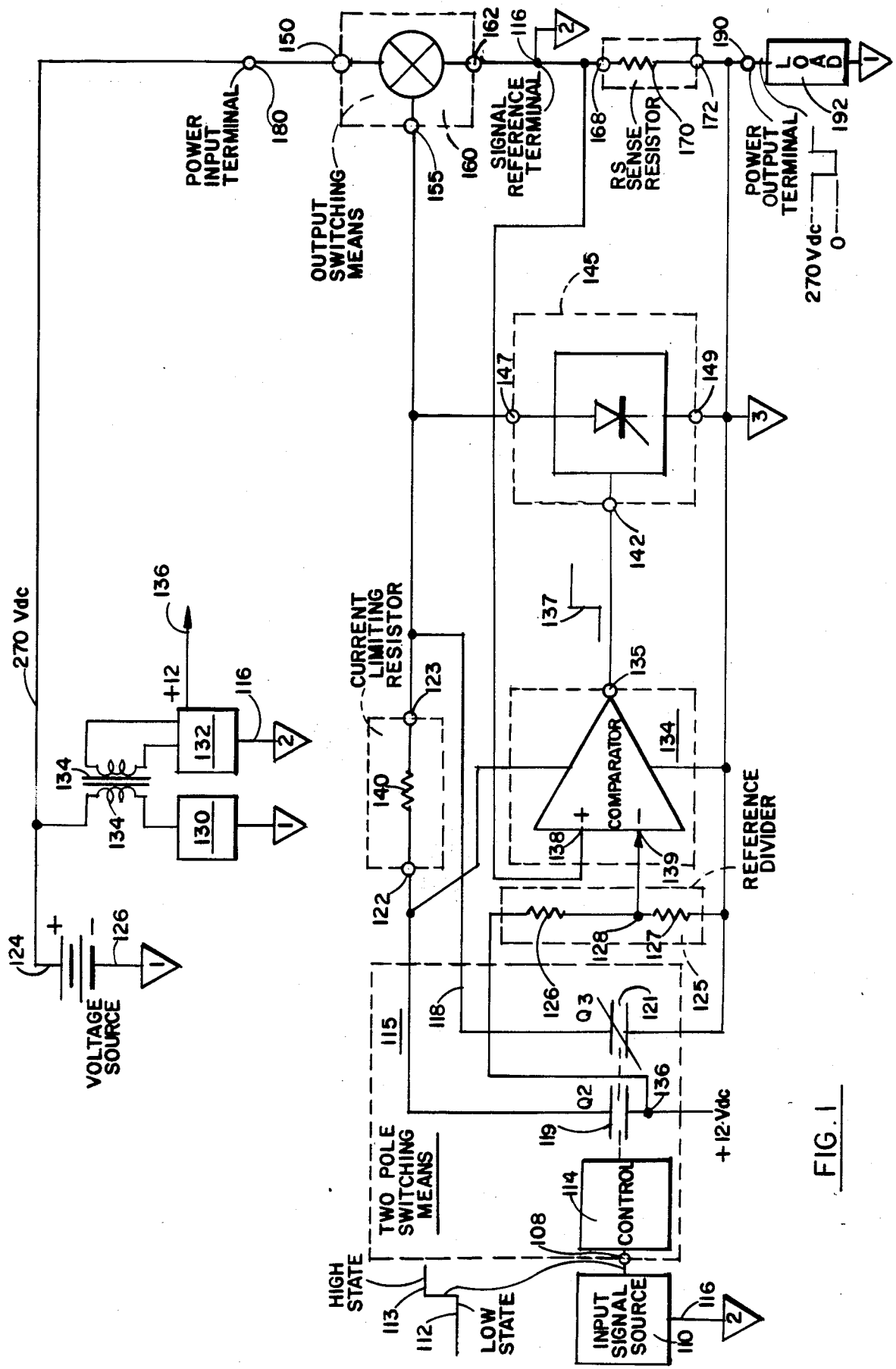
FIG. 1 is a functional block diagram of the solid state dc power switch.

FIG. 1 shows the invention dc power switch having an input signal terminal 108 coupled to an input signal source 110. The input signal source provides an input signal voltage characterized by wave form 112 that is referenced to a signal reference terminal 116, ground 2. The input signal has a high state 113 and a low state. The dc power switch has a power input terminal 180 connected to a dc voltage source 124 and a power output terminal 190 connected to load 192. The dc voltage source 124 has a power return terminal 126 coupled to receive current from the load 192. The load is referenced to ground 1 as is the voltage source 124.

The invention dc power switch comprises at least one isolated voltage source, such as the isolated voltage source represented by blocks 130, 132 and transformer 134. Transformer 134 is shown having a primary winding on the left and a secondary winding on the right. Block 130 is meant to represent a switching or power modulator stage well known in the art for periodically switching the lower end of the primary to ground 1. The switch on time vs. the switch off time is customarily referred to as the duty ratio. Block 132 is coupled to the secondary of transformer 134. In conventional isolated voltage sources, block 32 typically contains a rectifier and filter means augmented to produce a filtered and isolated output voltage.

An isolated voltage source is typically a dc-dc converter. Commercial isolated voltage sources are available from PICO Electronics. PICO sells a product line referred to as the "Series A Hi Rel Ultra Miniature dc-dc Converters". A battery powered regulator referenced to ground 2 adjusted to produce +12 V represents the simplest type of isolated voltage source, but not one suitable for long term reliable operation. The isolated voltage source, such as the +12 V source 136 is referenced to the signal reference terminal 116, ground 2. All ground 2 terminals are common. All ground 2 terminals are isolated from ground 1 terminals.

Current limiting resistor 140 has a first and second terminal 122, 123, respectively. Phantom block 115 represents a two-pole switching means having a first and second pole represented by universal closures 119 and 121, respectively. The pole or universal closures are indicated to be responsive to the control function provided by block 114. The control function 114 represents a solid state function that responds to the input signal high state 113 to couple the isolated voltage source, +12 V referenced to ground 2 to the current limiting resistor 140 first terminal 122. The voltage at the current limiting resistor second terminal 123 represents a "control signal high state" in response to closure of the normally open switch 119. The second pole, i.e. closure 121, is a normally closed switch responsive to the input signal high state 113 for disconnecting the current limiting resistor second terminal 123 from the power output terminal 190 in response to the input signal high state.

Phantom block 160 represents an output switching means having a conduction channel with first and second terminal, 150, 162. The conduction channel first terminal is coupled to the voltage source 124, typically a 270 V dc service. The output switching means conduction channel second terminal is coupled to the signal reference terminal 116, ground 2. The current limiting resistor second terminal 123 is coupled to the output switching means control terminal 155. The output switching means is responsive to the control signal high state applied to the control terminal 155 for coupling current from the voltage source 124 via the conduction channel between the conduction channel first terminal 150 and the conduction channel second terminal 162 to the signal reference terminal 116. The output switching means interrupts the current from the dc voltage source to the signal reference terminal 116 in response to a control signal low state applied to its control terminal 155.

A sense resistor 170 is shown having a first and second terminal, 168, 172, respectively. The sense resistor first terminal 168 is coupled to the signal reference terminal 116 and the sense resistor second terminal 172 is coupled to the power output terminal 190.

An SCR switching means is represented by the contents of phantom block 145 having a gate terminal 142, a conduction channel having a first and second terminal 147, 149, respectively. The first conduction channel terminal 147 is coupled to the current limiting resistor second terminal 123 and the second conduction channel terminal 149 is coupled to the power output terminal 190.

Phantom block 125 represents a reference divider having a first and second resistor 126, 127 coupled in series between the isolated voltage source, via terminal 136 and the power output terminal 190. The resistors are joined at a divider terminal 128.

Differential comparator 134 has an output terminal 135 coupled to the SCR switching means gate terminal 142. The differential comparator has a non-inverting input 138 coupled to the signal reference terminal 116, ground 2 and an inverting input 139 coupled to the sense resistor divider terminal 128. The sense signal voltage at the divider terminal 128 is measured with respect to the signal reference terminal, ground 2. The sense signal voltage is a portion of the isolated voltage at terminal 136 minus the product of the load current passing through the sense resistor 170 times the resistance of the sense resistor. The sense signal voltage of the isolated voltage is established by the values of the first and second resistors 126 and 127. The portion is equivalent to the resistance value of the second resistor 127 divided by the sum of the first and second resistors 126, 127, respectively.

The comparator provides a firing voltage at its output terminal 135 to the SCR switching means gate terminal 142 in response to the magnitude of the sense signal voltage at divider terminal 128 increasing negatively in response to increasing load current. As load current increases, the voltage drop across the sense resistor 170 increases as a direct function of the value of the load current. Terminal 190 moves in a negative direction with respect to the signal reference terminal 116 as load current increases. As the voltage at power output terminal 190 moves in a negative direction, the voltage at the divider terminal 128 also moves in a negative direction as a result of the voltage change at the power output terminal 190 with respect to the signal reference terminal.

First and second reference divider resistors 126, 127 are selected to have values such that the voltage at divider terminal 128 is normally positive with respect to the signal reference voltage at the non-inverting input to comparator 134. This condition results in the comparator providing a low output under normal conditions. The divider voltage is typically to be approximately 1 V more positive than the signal reference terminal with no current through the sense resistor 170. As current through the sense resistor is increased, the voltage at the divider terminal 128 moves negatively until it penetrates the threshold established by the voltage at the signal reference terminal which is coupled to the non-inverting input 138 of comparator 134. As the voltage at comparator inverting input 139 moves below the voltage at comparator input 138, the comparator provides the required firing voltage at output terminal 135 by changing its state from a low voltage to a high voltage as characterized by waveform 137.

The SCR switching means 145 latches into a conducting state in response to the firing signal and shunts current from the isolated source 136, via switch 119 to terminal 122 via the current limiting resistor second terminal 123 to the power output terminal 190, thereby shunting the control signal high state at output switching means terminal 155 to a control signal low state in response to the firing. In this way, the output switching means 160 responds to the low at its control terminal 155 to interrupt current to the load 192 in response to current through the sense resistor 170 exceeding a predetermined limit.

Figure 2:
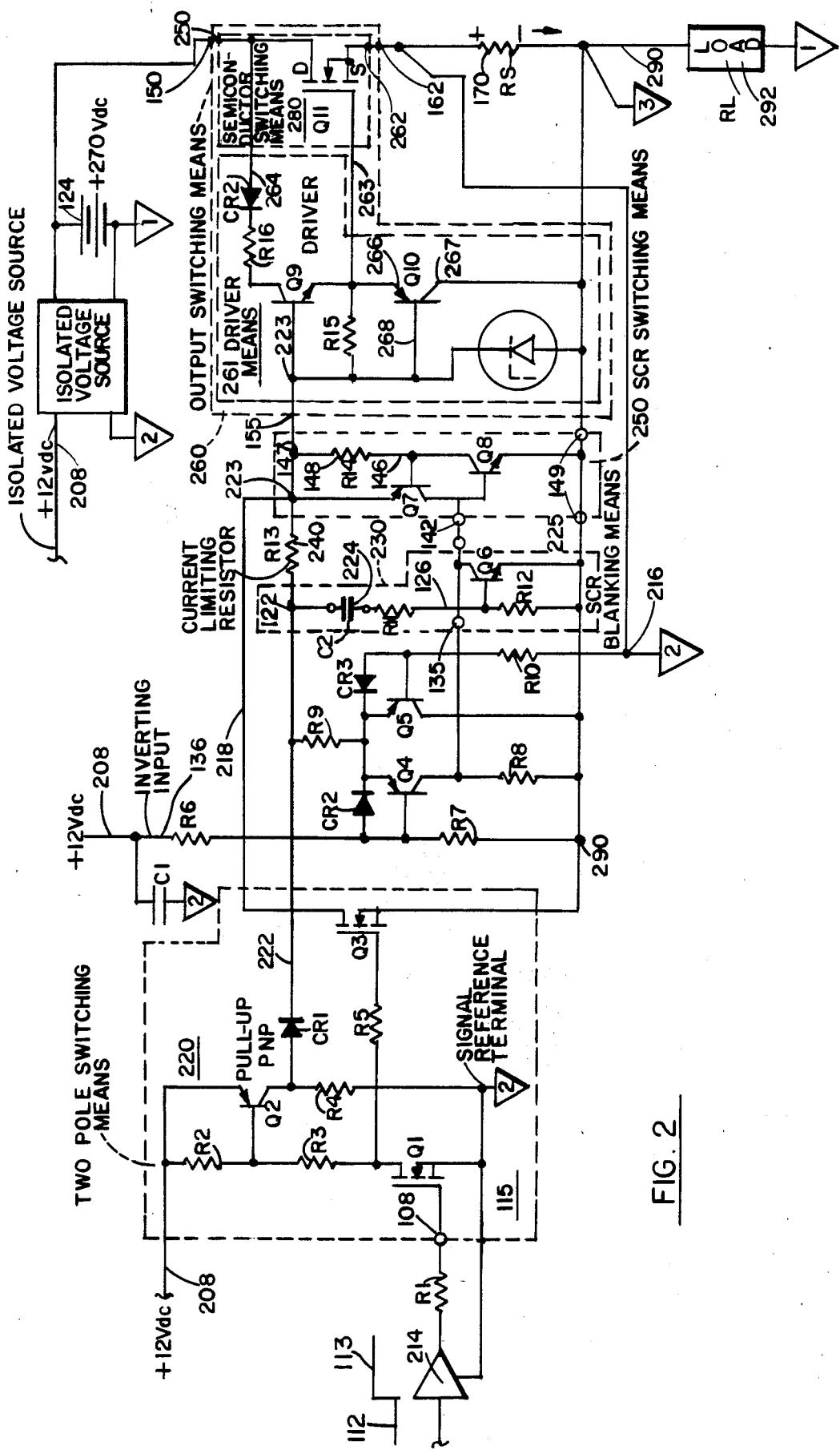
FIG. 2 is a schematic of the dc solid state power switch circuit.

Referring to FIG. 2, phantom block 260 represents the output switching means characterized by phantom block 160 in FIG. 1. Phantom block 261 represents a driver means having a conduction channel formed by a current path from driver conduction channel first terminal 264 through CR-2, R16, Q9 and then to driver conduction channel second terminal 263. The driver has a control terminal 223 coincident with the control terminal for the output switching means. The semiconductor switching means conduction channel first terminal is common with the output switching means conduction channel first terminal and the driver means conduction channel first terminal 264 is coupled to the output switching means conduction channel first terminal 250. The circle diode is a Zener diode. The use of this Zener diode represents good design practice. It's use provides protection against exceeding the GATE-2 source voltage of Q11. Under normal operating conditions, the breakdown voltage of this Zener is never exceeded. The semiconductor switching means conduction channel second terminal 262 is common to the output switching means conduction channel second terminal characterized as terminal 162 in FIG. 1.

The driver means conduction channel second terminal 263 is coupled to and common with the semiconductor switching means control terminal. The driver means control terminal is coupled to the output switching means control terminal 155. The semiconductor switching means Q11 is characterized to couple the dc voltage source 124 to the output switching means conduction channel second terminal 162 in response to the control signal high state being applied to the driver means control terminal 223.

In a more particular embodiment, the driver means 261 has a driver sink transistor Q10. The use of the phrase "sink" is meant to convey the concept of conventional current only entering the node. A "sink transistor" is a transistor that provides a path for conventional current to leave one node and be returned to a datum or reference node. A "sink terminal" is meant to convey the notion of a terminal into which conventional current flows. This transistor has a conduction channel having a first and second terminal 266, 267 and a control terminal, such as base 268. The driver sink transistor conduction channel first terminal 266 is coupled to the driver means conduction channel second terminal 263. The sink transistor conduction channel second terminal 267 is coupled to the power output terminal 290. The sink transistor control terminal 268 is coupled to the driver means control terminal 223.

Referring to FIG. 2, phantom block 280 represents the semiconductor switching means. In this more particular embodiment, the semiconductor switching means is an N-channel insulated gate field effect transistor Q11 having a DRAIN D coupled to the semiconductor switching means conduction channel first terminal 250, a SOURCE S coupled to the semiconductor switching means conduction channel second terminal and a gate coupled to the driver means conduction channel second terminal 263.

Figure 2A:
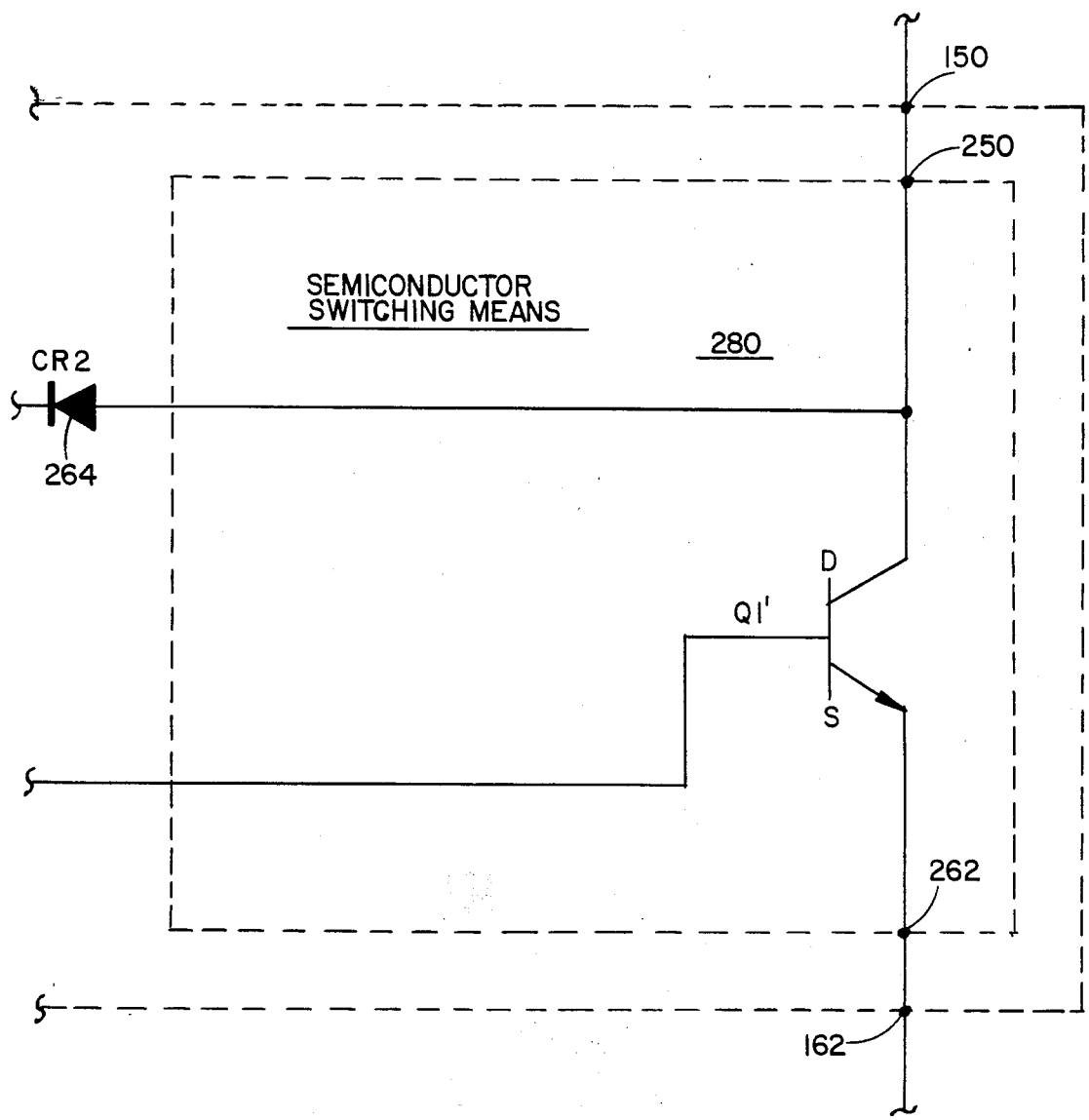
FIG. 2a is an alternative embodiment of the semiconductor switching means.

In an alternative embodiment, FIG. 2a, an NPN bipolar transistor having a collector coupled to the output switching means conduction channel first terminal 150, an emitter coupled to the output switching means conduction channel second terminal 162 and a base coupled to the driver means conduction channel second terminal 263 will perform the same function as that performed by FET Q11.

Figure 3:
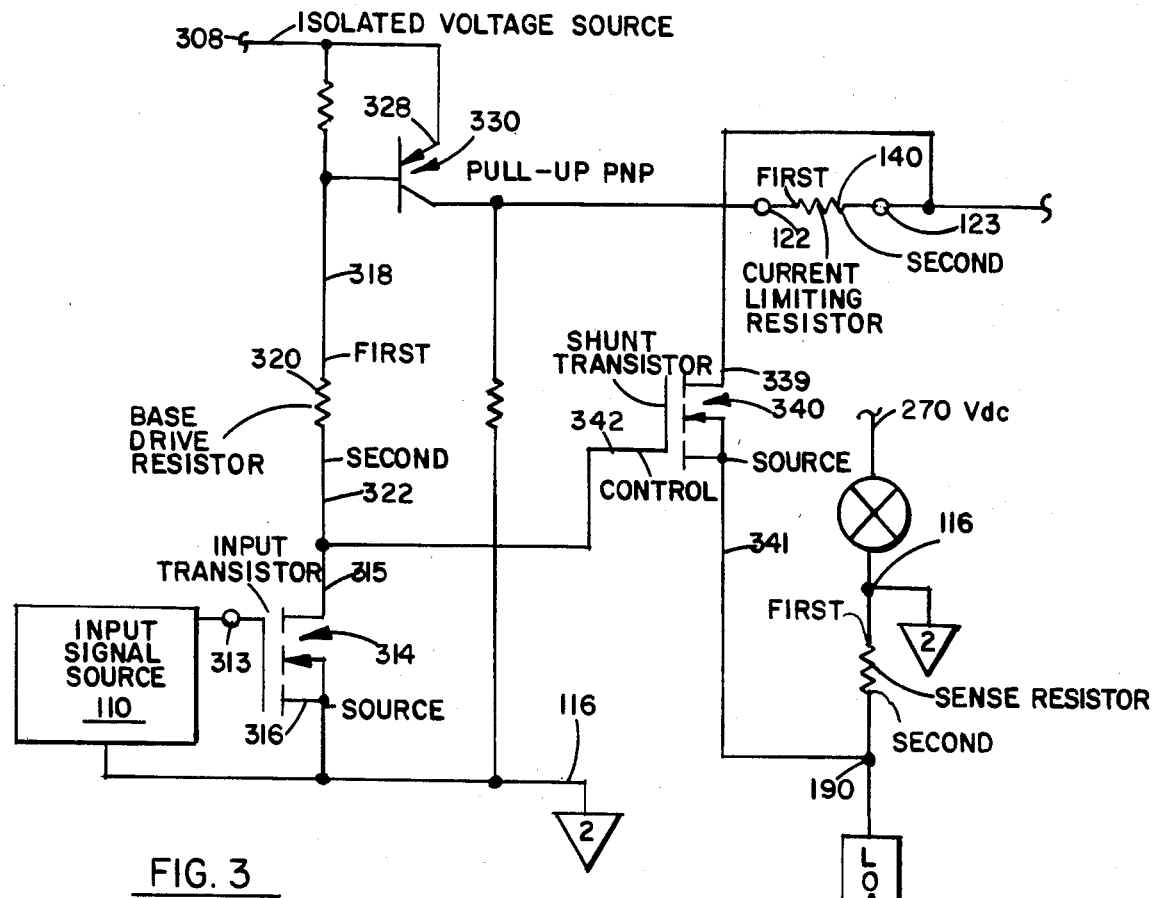
FIG. 3 is an expanded schematic of an embodiment of a circuit for a two-pole switching means.

FIG. 3 shows an embodiment of the two-pole switching means of phantom block 115 in FIG. 2. The circuit of FIG. 3 shows base drive resistor 320 having a first and second terminal 318, 322 respectively. PNP transistor 330 represents a pull-up PNP transistor having an emitter 328 coupled to the isolated voltage source 308, typically a +12 V regulated source referenced to ground 2 and isolated from ground 1. The pull-up PNP transistor 330 has a collector coupled to the current limiting resistor first terminal 122 and a base connected to the base drive resistor first terminal 318.

FIG. 3 shows an input transistor 314 having a conduction channel having a sink terminal 315, for sinking current and a source terminal 316 for sourcing current. The sink terminal 315 is connected to the base drive resistor second terminal 322. The source terminal is coupled to the signal reference terminal, ground 2, 116. The control terminal 313 is coupled to receive the input signal from input signal source 110.

Shunt transistor 340 represents a switch pole that is normally closed such as the function performed by switch 121 in FIG. 1. The shunt transistor has a sink and source terminal 339, 341 respectively. The sink terminal 339 is coupled to the current limiting resistor second terminal 123. The source terminal 341 is coupled to the power output terminal 190. The control terminal 342 is coupled to the input transistor sink terminal 315.

Figure 4:
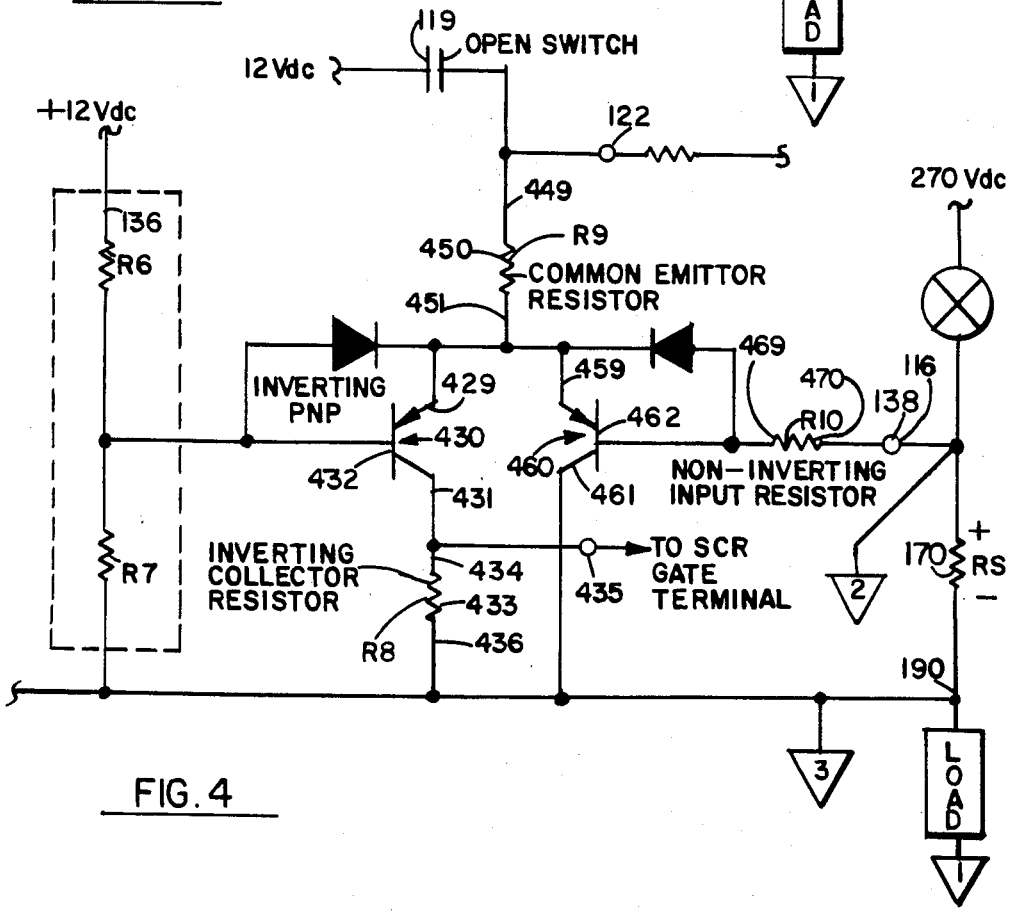
FIG. 4 is an expanded schematic of an embodiment of a circuit for a differential comparator.

FIG. 4 characterizes an expanded view of the differential comparator circuit contained within phantom block 134 in FIG. 1. The comparator circuit is also characterized in FIG. 2 by the topology associated with transistors Q4 and Q5. FIG. 4 shows R9 as a common emitter resistor 450 having a first and second terminal 449, 451 respectively. The first terminal is coupled to the current limiting resistor first terminal 122.

Inverting PNP transistor 430 has an emitter 429 coupled to the common emitter resistor second terminal 451; a collector 431 and a base 432. R8 represents an inverting collector resistor 433 having a first and second terminal 434, 436 respectively. The first terminal 434 is coupled to the inverting PNP transistor collector 431 and to the comparator output terminal 435. Comparator output terminal 435 is common with comparator output terminal 135 in FIG. 1. The inverting collector resistor second terminal 436 is coupled to the power output terminal 190.

FIG. 4 shows a non-inverting PNP transistor 460, an emitter 459 coupled to the common emitter resistor terminal 451; a collector 461 coupled to the power output terminal 190 and a base 462.

FIG. 4 shows a non-inverting input resistor R10 470 having a first and second terminal 469, 471 respectively. The first terminal is coupled to the non-inverting PNP transistor base 462 and the second terminal is connected to the comparator non-inverting input terminal 116. The second terminal of the non-inverting input resistor is common to the non-inverting input 138 to differential comparator 134. PNP transistors 430, 460 each have a base-to-emitter diode polarized to be forward biased under conditions where the base is driven positive with respect to the emitter.

Referring to FIG. 2, phantom block 250 represents an SCR switching means having a gate terminal 142 and a conduction channel having a first and second terminal 147, 149 respectively. The SCR means has a PNP resistor 148 having a first terminal coupled to the current limiting resistor second terminal 123 and a second terminal 146. The SCR switching means has PNP transistor Q7 having an emitter coupled to the current limiting resistor second terminal 123, a base coupled to the PNP resistor second terminal 146; and a collector coupled to the SCR switching means gate terminal 142. An SCR switching means NPN transistor Q8 is shown having an emitter coupled to the power output terminal 290, a base coupled to the comparator output terminal and to the Q7 collector, and a collector coupled to the PNP transistor Q7 base. The PNP transistor Q7 collector is connected to the NPN transistor Q8 base.

Phantom block 225 represents an SCR blanking circuit. The SCR blanking circuit has a blanking capacitor C2. The capacitor C2 has a first terminal coupled to the current limiting resistor first terminal 122 and a second terminal 224. Blanking resistor R11 has a first terminal coupled to the blanking capacitor second terminal 224 and a second terminal 126. Q6 represents a blanking NPN transistor having a base coupled to the blanking resistor second terminal 126, an emitter coupled to the power output terminal 290 and a collector coupled to the SCR NPN transistor base 142.

DC SWITCHING MEANS

FIG. 2 is a dc switch circuit for use with a +270 Vdc. The circuit of FIG. 2 is used with an SSPC configured for dc operation or in any circuit application requiring an overcurrent trip mounting capability. The dc switch circuit of FIG. 2 has a two pole switching means, such as that contained in phantom block 220. In operation, the dc driver receives an ON signal such as that characterized by wave form 212 at the input of buffer amplifier 214. Logic signal 212 is a +5 V logic signal similar to a control signal from a microprocessor. As signal 212 rises from a low logic level 112 to a positive logic level 113, the output of buffer amplifier 214 also goes positive, turning on the Q1 FET. The turn-on of Q1 results in Q2 turning on and Q3 turning off. Q2 connects the isolated +12 V voltage source via CR1 and signal line 222 to the first terminal of current limiting resistor 240 as Q3 cuts off releasing SINK LINE 218 from its connection to output terminal 290.

As the positive input signal 212 rises to a positive level, Q1 and Q2 become conductive coupling the isolated 12 V source at 208 via Q2 and CR1 forming a positive drive signal applied to signal line 222. Signal line 222 rises abruptly to +12 V isolated logic source level minus one diode drop and the saturated voltage drop across transistor Q2.

SCR GATE BLANKING

Phantom block 230 represents an SCR GATE BLANKING circuit.

NPN transistor Q6 is momentarily driven into conduction by the positive rise on signal line 222 via C2 to the base of Q6. Q6 operates to momentarily short the base of Q8 to ground. The combination of Q7 and Q8 are connected to operate as an SCR equivalent with the base of Q8 forming the equivalent of an SCR gate. As Q6 switches the base of Q8 to ground during the application of a control signal to signal line 222, the SCR combination of Q7 and Q8 is momentarily disabled. The Q6 circuit operates to reduce the sensitivity of the Q7 and Q8 two transistor group to high dv/dt rates of voltage change on signal line 147.

DIFFERENTIAL COMPARATOR

Referring to FIG. 2, the dual PNP transistor network formed by Q4 and Q5 form a differential comparator. Transistor Q4 typically receives a precision reference voltage level at its base from a precision reference level source such as a three-terminal regulator (not shown) via R6 and R7. Capacitor C1 is a high frequency decoupling capacitor. The precision level on the base of Q4 is typically 1.0 Vdc. Q4 is typically off in normal operation and Q5 is typically on or in conduction. Q5 is biased into conduction via the path from the signal line 222 when the signal line goes high via R9, the base to emitter junction of Q5, R10 to the signal reference terminal 216. Voltage is applied to load RL, 292 as FET Q11 is commanded ON. FET Q11 is an N-channel enhancement mode insulated gate power FETs having drain to source voltage ratings in excess of 400 V.

Referring again to FIG. 2, FET Q11 is commanded ON by the positive rise in voltage on signal line 222 via R13 and Q9 to the gate of FET Q11. Q9 provides as much current to its emitter from the +270 Vdc source via CR2, R16, and its collector to keep the emitter voltage one diode drop below the base voltage. Q9 therefore operates to provide a buffered positive drive signal to the gate of FET Q11. Conversely, PNP transistor Q10 provides a buffered negative drive signal to sink the gate of FET Q11 to power input terminal 290 in response to a drop in voltage on signal line 222.

TOTEM-POLE DRIVER

The combination of NPN transistor Q9 and PNP transistor Q10 form a conventional totem-pole driver for the gate of FET Q11 and have the ability to rapidly drive the gate positive or negative as required in response to a signal on signal line 222. As current through FET Q11 rises in response to a reduction in load impedance, voltage develops across sense resistor RS. The voltage at node 290 goes negative with respect to node 216. Overcurrent operation causes a voltage rise across sense resistor RS, R17 driving the base of Q4 in a negative direction via R7 from node 290. As the current through sense resistor RS exceeds the rated limit of the dc SSPC, the voltage at node 290 lowers the base voltage on transistor Q4 to the point where Q4 turns ON. Q4 turns ON in response to this condition, thereby developing a positive voltage on R8.

SCR LATCH-UP

As the voltage on R8 rises and exceeds the base-to-emitter junction voltage of Q8, Q8 starts to conduct lowering the voltage on the base of Q7 to the point where the base-to-emitter junction of Q7 becomes forward biased. Q7 conducts turning on Q8 and Q8 regenerates the conduction of Q7 by providing additional gate drive for Q7. The combination of Q7 and Q8 therefore latches as an SCR combination clamping node 223 to a voltage equivalent to 1 VBE+1 Vsat above the voltage of node 217. The clamping operation of the Q7 and Q8 operate to turn Q9 off immediately and to turn Q10 ON immediately, thereby connecting the gate of FET Q11 to a voltage level approximating 1 Vbe above the voltage of reference node 217. When fired, current from R13 provides holding current for the Q7, Q8 SCR latch.

I claim:

1. A dc power switch having an input signal terminal coupled to an input signal source, said input signal source providing an input signal voltage with respect to a signal reference terminal, said input signal having a high state and a low state, said dc power switch having a power input terminal connected to a dc voltage source and a power output terminal connected to a load, said dc voltage source having a power return terminal coupled to receive current from said load; said dc power switch comprising:

at least one isolated voltage sorce, said isolated voltage source being referenced to said signal reference terminal;

an output switching means having a conduction channel having a first and second terminal and a control terminal, said conduction channel first terminal being coupled to said voltage source, said output switching means conduction channel second terminal being coupled to said signal reference terminal, said output switching means being responsive to a control signal high state applied to said control terminal for coupling current from said dc voltage source to said signal reference terminal in response to a control signal high state applied to its control terminal;

a sense resistor having a first and second terminal, said sense resistor first terminal being coupled to said signal reference terminal and said sense resistor second terminal being coupled to said power output terminal;

a means for interrupting said dc current to said load in response to said load current exceeding a predetermined threshold having:

a current limiting resistor having a first and second terminal, said second terminal being connected to said output switching means control terminal;

a two pole switching means having:

a first pole having a normally open switch responsive to said input signal high state for coupling said isolated voltage source to said current limiting resistor first terminal, the voltage at said current limiting resistor second terminal representing a control signal high state in response to closure of said normally open switch, and a second pole having a normally closed switch responsive to said input signal high state, for disconnecting said current limiting resistor second terminal from said power output terminal in response to said input signal high state;

means for latching into a tripped state to interrupt said dc current to said load in response to said load current exceeding a predetermined threshold by shunting said current limiting resistor second terminal to said power output terminal to remove said control signal high state from said output switching means control terminal and for automatically resetting from said tripped state upon reducing said load current to a value less than said predetermined threshold and upon removing said input signal high state.

2. The dc power switch of claim 1 wherein said means for latching into a tripped state to interrupt said dc current to said load in response to said load current exceeding a predetermined threshold further comprises:

an SCR switching means having
a gate terminal,
a conduction channel having
a first and second terminal, said first terminal being coupled to said current limiting resistor second terminal and second terminal being coupled to said power output terminal, said gate terminal being responsive to said means for latching said dc power switch into a tripped state to interrupt said dc current to said load in response to said load current exceeding a predetermined threshold and for automatically resetting from said tripped state upon reducing said load current to a value less than said predetermined threshold and upon removing said input signal high state.

3. The dc power switch of claim 2 wherein said means for latching into a tripped state to interrupt said dc current to said load in response to said load current exceeding a predetermined threshold further comprises:

a differential comparator having an output terminal coupled to said SCR switching means gate terminal, a non-inverting input coupled to said signal reference terminal, and an inverting input coupled to said sense resistor divider terminal, the sense signal voltage at said divider terminal being measured with respect to said signal reference terminal, said sense signal voltage being a portion of said isolated voltage minus the product of said load current times the resistance of said sense resistor, said comparator providing a firing voltage at its output terminal to said SCR switching means gate in response to the magnitude of said sense signal voltage increasing negatively in response to increasing load current penetrates the threshold of the signal reference terminal voltage at said non-inverting input, said SCR switching means latching into a conducting state in response to said firing signal and shunting current from said isolated source via said current limiting resistor second terminal to said power output terminal thereby shunting said control signal high state to a control signal low state in response to said firing;

whereby, said switching means operates to interrupt current to said load in response to current through said sense resistor exceeding a predetermined limit.

4. A dc power switch having an input signal terminal coupled to an input signal source, said input signal source providing an input signal voltage with respect to a signal reference terminal, said input signal having a high state and a low state, said dc power switch having a power input terminal connected to a dc voltage source and a power output terminal connected to a load, said dc voltage source having a power return terminal coupled to receive current from said load; said dc power switch comprising:

at least one isolated voltage sorce, said isolated voltage source being referenced to said signal reference terminal, a current limiting resistor having a first and second terminal;

a two pole switching means having
a first pole having a normally open switch responsive to said input signal high state for coupling said isolated voltage source to said current limiting resistor first terminal, the voltage at said current limiting resistor second terminal representing a control signal high state in response to closure of said normally open switch, and said second pole having a normally closed switch responsive to said input signal high state, for disconnecting said current limiting resistor second terminal from said power output terminal in response to said input signal high state;

an output switching means having a conduction channel having a first and second terminal and a control terminal, said conduction channel first terminal being coupled to said power input terminal, said output switching means conduction channel second terminal being coupled to said signal reference terminal, said current limiting resistor second terminal being coupled to said output switching means control terminal; said output switching means being responsive to said control signal high state applied to said control terminal for coupling current from said voltage source via said conduction channel to said signal reference terminal and for interrupting said current from said dc voltage source to said signal reference terminal in response to a control signal low state applied to its control terminal;

a sense resistor having a first and second terminal, said sense resistor first terminal being coupled to said signal reference terminal and said sense resistor second terminal being coupled to said power output terminal;

an SCR switching means having
a gate terminal,
a conduction channel having
a first and second terminal, said first conduction channel terminal being coupled to said current limiting resistor second terminal and second conduction channel terminal being coupled to said power output terminal, a reference divider having a first and second resistor coupled in series between said isolated voltage source and said power output terminal, said resistors being joined at a divider terminal, a sense signal voltage being provided at said divider terminal;

a differential comparator having an output terminal coupled to said SCR switching means gate terminal,
a non-inverting input coupled to said signal reference terminal, and
an inverting input coupled to said divider terminal, the sense signal voltage at said divider terminal being measured with respect to said signal reference terminal, said sense signal voltage being a portion of said isolated voltage minus the product of said load current times the resistance of said sense resistor, said comparator providing a firing voltage at its output terminal to said SCR switching means gate terminal in response to the magnitude of said sense signal voltage increasing negatively in response to increasing load current penetrates the threshold of the signal reference terminal voltage at said non-inverting input, said SCR switching means latching into a conducting state in response to said firing signal and shunting current from said isolated source via said current limiting resistor second terminal to said power output terminal thereby shunting said control signal high state to a control signal low state in response to said firing;

whereby, said output switching means operates to interrupt current to said load in response to current through said sense resistor exceeding a predetermined limit.

5. The dc power switch of claim 4 wherein said output switching means having a conduction channel having a first and second terminal and a control terminal, further comprises:

a driver means, having
a conduction channel having a first and second terminal and a control terminal, and
a semiconductor switching means having a conduction channel having a first and second terminal and a control terminal, said semiconductor switching means conduction channel first terminal and said driver means conduction channel first terminal being coupled to output switching means conduction channel first terminal, said semiconductor switching means conduction channel second terminal being coupled to said output switching means conduction channel second terminal, said driver means conduction channel second terminal being coupled to said semiconductor switching means control terminal, and said driver means control terminal being coupled to said output switching means control terminal, whereby; said semiconductor switching means is characterized to couple said dc voltage source to said output switching means conduction channel second terminal in response to said control signal high state being applied to said driver means control terminal.

6. The dc power switch of claim 5 wherein said driver means having a conduction channel having a first and second terminal and a control terminal further comprises:

a driver sink transistor having
a conduction channel having a first and second terminal and a control terminal, said driver sink transistor conduction channel first terminal being coupled to said driver means conduction channel second terminal, said sink transistor conduction channel second terminal being coupled to said power output terminal and said sink transistor control terminal being coupled to said driver means control terminal.

7. The dc power switch of claim 5 wherein said a semiconductor switching means having a conduction channel having a first and second terminal and a control terminal further comprises:

an n-channel insulated gate field effect transistor having a source coupled to said output switching means conduction channel first terminal, a drain coupled to said output switching means conduction channel second terminal and a gate coupled to said driver means conduction channel second terminal.

8. The dc power switch of claim 5 wherein said semiconductor switching means having a conduction channel having a first and second terminal and a control terminal further comprises:

an NPN bi-polar transistor having a collector coupled to said output switching means conduction channel first terminal, an emitter coupled to said output switching means conduction channel second terminal and a base coupled to said driver means conduction channel second terminal.

9. The dc power switch of claim 4 wherein said a two pole switchng means further comprises:
- a base drive resistor having a first and second terminal,
- a pull-up PNP transistor having
  - an emitter coupled to said isolated voltage source,
  - a collector coupled to said current limiting resistor first terminal, and
  - a base, connected to said base drive resistor first terminal,
- an input transistor having
  - a conduction channel having
    - a sink terminal connected to said base drive resistor second terminal,
    - a source terminal coupled to said signal reference terminal and
    - a control terminal coupled to receive said input signal,
- a shunt transistor having
  - a conduction channel having a sink and source terminal and a control terminal, said sink terminal being coupled to said current limiting resistor second terminal, said source terminal being coupled to said power output terminal, said control terminal being coupled to said input transistor sink terminal.

10. The dc power switch of claim 4 wherein said differential comparator further comprises:
- a common emitter resistor having a first and second terminal, said first terminal being coupled to said current limiting resistor first terminal;
- an inverting PNP transistor having
  - an emitter coupled to said common emitter resistor second terminal;
  - a collector and
  - a base, and
- a inverting collector resistor having a first and second terminal, said first terminal being coupled to said inverting PNP transistor collector, and to said comparator output terminal, said inverting collector resistor second terminal being coupled to said power output terminal,
- a non-inverting PNP transistor having
  - an emitter coupled to said common emitter resistor second terminal;
  - a collector coupled to said power output terminal and
  - a base, and
- a non-inverting input resistor having a first and second terminal, said first terminal being coupled to said non-inverting PNP transistor base and said second terminal being connected to said comparator non-inverting input terminal.

11. The dc power switch of claim 4 wherein said SCR switching means further comprises:
- a PNP resistor having a first terminal coupled to said current limiting resistor second terminal, and a second terminal;
- an SCR PNP transistor having an emitter coupled to said current limiting resistor second terminal, a base coupled to said PNP resistor second terminal; and collector;
- an SCR NPN transistor having an emitter coupled to said power output terminal, a base coupled to said comparator output and, a collector coupled to the PNP transistor base; said PNP transistor collector being coupled to said NPN transistor base.

12. The dc power switch of claim 11 further comprising:
- an SCR blanking circuit having,
  - a blanking capacitor having a first terminal coupled to said current limiting resistor first terminal, and a second terminal;
  - a blanking resistor having a first terminal coupled to said blanking capacitor second terminal and a second terminal;
  - an blanking NPN transistor having a base coupled to said blanking resistor second terminal, an emitter coupled to said power output terminal and a collector coupled to said SCR NPN transistor base.

* * * * *